(12) United States Patent
Dona

(10) Patent No.: US 8,011,259 B2
(45) Date of Patent: Sep. 6, 2011

(54) SAMPLE CARRIER COMPRISING A DEFORMABLE STRIP OF MATERIAL FOLDED BACK UPON ITSELF AND SAMPLE HOLDER

(75) Inventor: Pleun Dona, Veldhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 12/786,974

(22) Filed: May 25, 2010

(65) Prior Publication Data

US 2010/0230609 A1 Sep. 16, 2010

Related U.S. Application Data

(63) Continuation of application No. 11/807,876, filed on May 29, 2007, now Pat. No. 7,767,979.

(30) Foreign Application Priority Data

May 29, 2006 (EP) .................................... 06114632

(51) Int. Cl.
*B01L 3/00* (2006.01)
*G21K 5/10* (2006.01)
(52) U.S. Cl. ................................ 73/864.91; 250/440.11
(58) Field of Classification Search ............... 73/864.91; 359/391; 250/440.11, 442.11
See application file for complete search history.

(56) References Cited

U.S. PATENT DOCUMENTS

| | | | | |
|---|---|---|---|---|
| 2,520,725 A | * | 8/1950 | Judd | 248/27.1 |
| 3,239,255 A | * | 3/1966 | Murcott | 403/329 |
| 3,307,035 A | * | 2/1967 | Gessner et al. | 250/440.11 |
| 4,462,142 A | * | 7/1984 | Hickling | 403/329 |
| 4,797,261 A | * | 1/1989 | Swann et al. | 422/65 |
| 5,089,708 A | | 2/1992 | Asselbergs | |
| 5,590,974 A | * | 1/1997 | Yang | 403/327 |
| 6,388,262 B1 | | 5/2002 | Alani et al. | |
| 6,841,788 B1 | * | 1/2005 | Robinson et al. | 250/492.3 |
| 6,995,380 B2 | | 2/2006 | Rasmussen | |
| 7,005,636 B2 | | 2/2006 | Tappel | |
| 7,034,316 B2 | | 4/2006 | Wagner et al. | |
| 7,291,847 B2 | | 11/2007 | Morrison | |
| 7,381,968 B2 | | 6/2008 | Tanaka et al. | |
| 2005/0035302 A1 | * | 2/2005 | Morrison | 250/442.11 |
| 2005/0230636 A1 | * | 10/2005 | Tanaka et al. | 250/440.11 |
| 2006/0239868 A1 | * | 10/2006 | Sage et al. | 422/104 |

FOREIGN PATENT DOCUMENTS

| | | |
|---|---|---|
| CN | 1300095 | 6/2001 |
| JP | 04206333 | 7/1992 |
| WO | 9620495 | 7/1996 |

* cited by examiner

*Primary Examiner* — Hezron E Williams
*Assistant Examiner* — Nathaniel Kolb
(74) *Attorney, Agent, or Firm* — Scheinberg & Griner, LLP; Michael O. Scheinberg; David Griner

(57) ABSTRACT

The invention relates to a composite structure of a sample carrier 20 and a sample holder 30 for use in a TEM, for example. The sample carrier is hereby separately embodied from the sample holder. Although such compositions are already known, the known compositions are very fragile constructions. The sample carrier according to the invention can be formed from a strip of metal, and is a simple and cheap element. Using resilient force, it clamps onto or into the sample holder. The portion of the sample holder to which the sample carrier couples also has a simple form. The sample carrier can couple to the sample holder in vacuum using a coupling tool.

18 Claims, 4 Drawing Sheets

(Side view along BB')

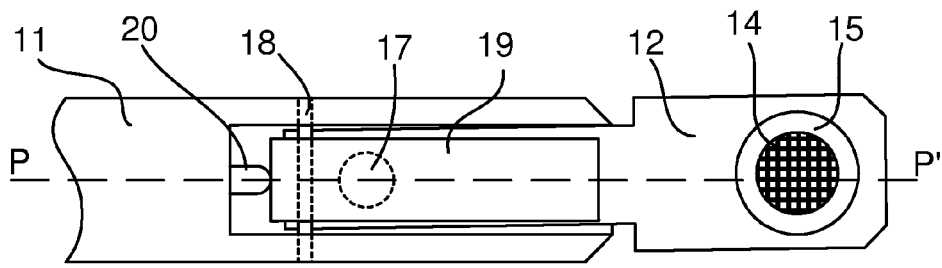
(top view)
FIG. 1A (PRIOR ART)
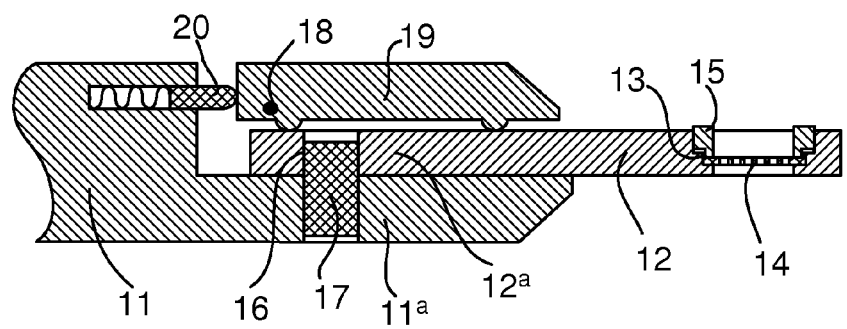
(side view through PP')
FIG. 1B (PRIOR ART)
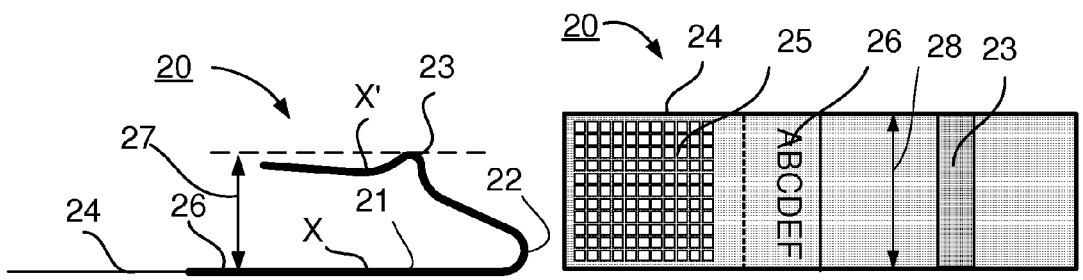
(side view)
FIG. 2A
(top view)
FIG. 2B

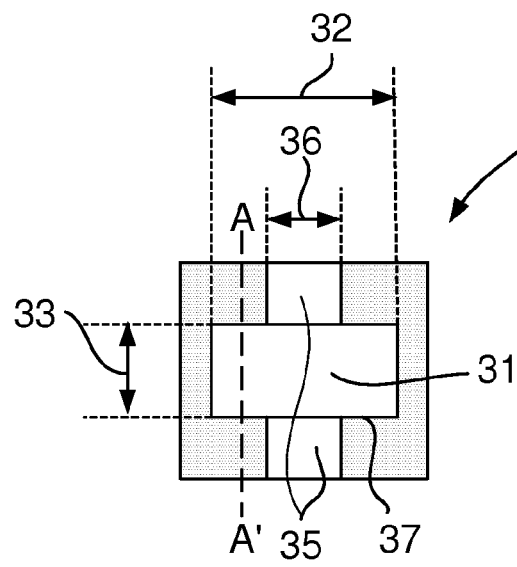
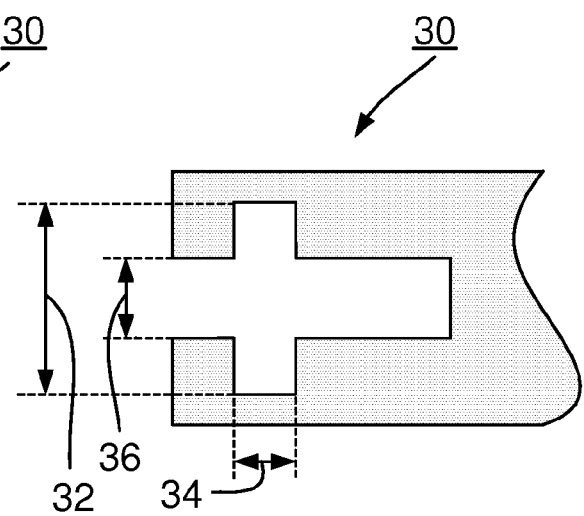
(front view)
FIG. 3A
(top view)
FIG. 3B
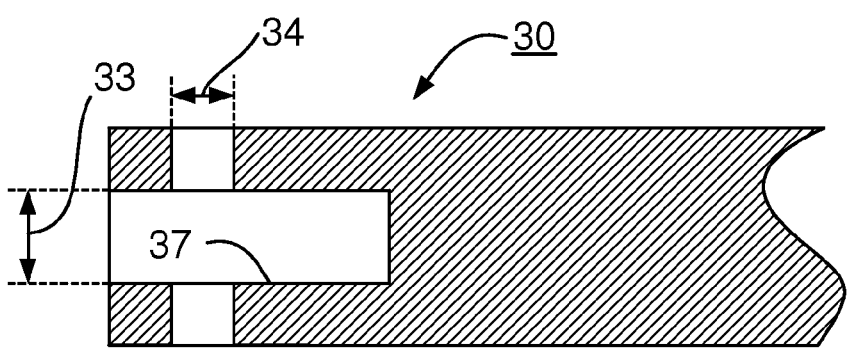
(side view along AA')
FIG. 3C

(top view)

(Side view along BB')

(top view)

(side view along CC')

(top view)

(top view)

(top view)

(top view)

(top view)

SAMPLE CARRIER COMPRISING A DEFORMABLE STRIP OF MATERIAL FOLDED BACK UPON ITSELF AND SAMPLE HOLDER

This application is a Continuation of U.S. application Ser. No. 11/807,876, filed May 29, 2007, now U.S. Pat. No. 7,767,979 which is hereby incorporated by reference.

TECHNICAL FIELD OF THE INVENTION

The invention relates to a co-operative composite structure of a sample carrier and sample holder arranged so that a sample can be attached thereto, which sample carrier and sample holder are arranged to be used in a vacuum, comprising:

A first portion embodied as a sample holder with an extremity that is arranged to be removably attachable to the sample carrier, and;

A second portion embodied as a sample carrier, arranged so that the sample can be attached thereto or thereon, which sample carrier is also arranged to be removably attachable to the sample holder;

Whereby the removable attachment functionality is realized with the aid of clamping by a resilient element.

BACKGROUND OF THE INVENTION

The invention also relates to a method of removably attaching and separating such a co-operative composite structure.

Such a co-operative composite structure is known from Japanese patent document No. JP-A-H04-206333.

Such a co-operative composite structure is used, for example, in inspecting samples with the aid of a Transmission Electron Microscope (TEM), e.g. in biological or materials science research laboratories and in the pharmaceutical industry. Such a co-operative composite structure is also used, for example, in inspecting samples such as are extracted from semiconductors in the semiconductor industry.

In a TEM, for example, a parallel, high-energy beam of electrons with an energy of, for example, 300 keV is shot at the sample. As a result of interaction between the electrons and the sample, electrons in the beam will, for example, be deflected, lose energy or be absorbed, which can yield information about the sample. By arranging the electron beam to impinge in the correct manner upon, for example, a fluorescent screen and/or a CCD camera, the information can be rendered visible.

The sample can also be irradiated by a focused beam, which beam is moved across the sample. In this mode of operation of a TEM, the so-called Scanning Transmission Electron Microscopy mode (STEM mode), position-dependent information in the form of secondary particles, such as secondary electrons and X-rays, is produced. In the case of inspection with a TEM, a very high resolution can be achieved. Nowadays, a resolution of better than 0.1 nm is achievable. In addition, it is, for example, possible to obtain position-dependent information about the material constitution using X-ray analysis in a TEM.

As a result of the strong interaction between electrons and material, a sample for a TEM should be very thin. If a sample is too thick, no or virtually no electrons will pass through it. A suitable thickness for a sample is less than, for example, 100 nm, and preferably less than 50 nm.

TEM samples with a thickness of, for example, less than 100 nm are of themselves too fragile to be manipulated with a manipulator, and are usually mounted on a thin round foil with a diameter of 3.05 mm and a thickness of, for example, less than 20 μm. The central portion of such a foil is embodied as a gauze, whereby the electrons can move through the sample and through the holes in the gauze without being absorbed by the material of the foil. This foil—the so-called grid—is subsequently mounted in a hollow of a sample holder, which sample holder in turn is attached to a manipulator of the TEM. Such grids, made from various materials and with various sizes of the meshes of the gauze and a thickness of, for example, about 15 μm, are commercially available.

So as to be able to properly study a sample, it is not only necessary to position the electron beam with respect to the sample, but it is often also necessary to be able to inspect the sample at an angle. To this end, not only does the manipulator move the sample holder—and, thereby, also the sample—in an x-y plane perpendicular to the electron beam, but it can also turn, for example, about the longitudinal axis of the sample holder, in the x-y plane (the so-called α-tilt). The sample holder can also be arranged in such a way that the extremity hereof, on which the sample is mounted, can also cant in a canting direction located in the x-y plane and perpendicular to the α-tilt—the so-called β-tilt. Moreover, one ensures in this manner that the middle of the sample stays at the same position, the so-called Eucentric position.

Because the space that is available between the pole pieces of the lenses of a TEM is very limited, this all has to fit into a very small space. One must realize here that the extremity of the sample holder in its un-canted state must fit within a cylinder with a diameter of, for example, 5 mm.

In view of the resolution of, for example, less than 0.1 nm that can be achieved with a TEM, sample holders must also be mechanically very stable. It should also be noted that the extremity of a sample holder, together with the facilities that are necessary to make the canting motion possible, has to operate in vacuum, which places restrictions on, for example, the use of lubricants and plastics. Finally, it should be noted that there are sample holders that must be able to operate at very low temperatures (e.g. the temperature of liquid helium) or very high temperatures (e.g. 500° C.).

Sample holders are therefore often expensive and fragile components, with a very specific form.

So as to give a sample a thickness of, for example, 50 nm, the sample will have to be thinned before it is studied in a TEM. This can, for example, be done by shooting an ion beam at it in vacuum in another apparatus, whereby so-called ion milling occurs.

In a method that is often used, the sample is first mounted on a TEM grid, after which the sample holder is introduced into an apparatus that comprises both a column of a Scanning Electron Microscope (SEM) and a column of a Focused Ion Beam (FIB). Such apparatus are commercially available, e.g. the DualBeam™ apparatus of the firm FEI Company in Hillsboro, USA.

In such a DualBeam™ apparatus, the sample is first localized on the grid with the aid of the SEM column, after which it is subsequently thinned to the desired thickness using the FIB column, while the progress of the thinning operation is monitored with the aid of the SEM column.

It should be clear that, in performing this method, it is preferable if the very fragile grid, which is only about ten micrometers thick, only has to be mounted on a sample holder once. Demounting the grid from a sample holder, and subsequent re-mounting on another sample holder, leads to a significant loss of time, and there is an additional significant risk that the grid, and the sample mounted thereon, will be damaged. However, the sample holder and manipulator of, for example, a DualBeam™ apparatus have a different form to those of a TEM, inter alia because the motional degrees of freedom in a DualBeam™ apparatus are much greater.

It should be noted that it may be desirable to study the sample in apparatus other than a TEM, such as an X-ray analyzer, an Auger spectroscope, or a SIMS apparatus (Secondary Ion Mass Spectrometer). These apparatus usually have different sample holders and manipulators to those that are used in a TEM. However, it is also preferable in this case if the fragile grid only has to be mounted once. In general, a TEM will place the greatest restrictions on the sample holder as regards size.

The co-operative composite structure of sample holder and sample carrier known from JP-A-H04-206333 aims to improve the interchangeability of samples. To this end, the sample is first mounted on a grid, after which the grid is mounted on a sample carrier in the form of a thin plate, which sample carrier can be attached to the sample holder. This plate is sufficiently robust to be easily exchangeable between different apparatus.

The known co-operative composite structure is schematically shown in FIGS. 1A and 1B. The operation of the known co-operative composite structure will now first be discussed.

The grid 14, to which a sample can be attached, is laid within a hollow 13 of the sample carrier 12, and subsequently fixed in place using a pressing screw 15. The sample carrier 12 exhibits an extremity 12a with a hole 16. The sample holder 11 has an extremity 11a with a pin 17 thereon. The sample holder also exhibits a resilient element 19 that closes across the extremity 11a. By opening the resilient element 19 against the resilient force, the extremity 12a of the sample carrier 12 can be laid upon the extremity 11a of the sample holder 11, in such a manner that the hole 16 falls over the pin 17 in the sample holder. By now releasing the resilient element 19, this will close across the extremity 12a of the sample carrier 12, as a result of which the sample carrier 12 will be clamped between the resilient element 19 and the extremity 11a of the sample holder 11.

The known co-operative composite structure is a complex arrangement with many components. One must remember in this context that the maximal width and cross-section of both the sample carrier and the sample holder may only be a few millimeters, so as to have enough room in the TEM to be able to cant, for example. The screw with which the grid is mounted on the sample carrier is a fragile component, which is difficult to handle during assembly. The screw thread in the sample carrier is also fragile, and careless treatment will easily cause the screw, the sample carrier or both to be damaged. Manufacture of the screw and the screw thread requires precision mechanical techniques, which leads to high costs.

The axle of the turning mechanism via which the resilient element closes itself is small, and therefore fragile. The spring that yields the resilient force is very small, and should be enclosed in a small space. Consequently, jamming of the resilient element can easily occur, as a result of which the resilient element no longer easily closes, and damage to the spring, the resilient element or the axle easily occurs. It should be noted in this regard that, for use in vacuum, no or only a few lubricants can be employed.

As a result of the abovementioned fragility and the increase in friction in vacuum, the known co-operative composite structure is not suitable for mounting the sample carrier onto the sample holder in vacuum. The known co-operative composite structure therefore does not lend itself to the automatic exchange of samples in vacuum.

The invention aims to provide a co-operative composite structure of sample carrier and sample holder that has a simpler and more robust composition than the known co-operative composite structure.

To this end, the co-operative composite structure according to the invention is characterized in that the resilient element is part of the sample carrier.

The invention is based upon the insight that the method whereby the sample is first mounted on a grid (as has historically evolved in the course of many tens of years), this grid is subsequently mounted on the sample carrier, and the sample carrier is then coupled to the sample holder, is unnecessarily complicated. In addition, the construction that results herefrom, whereby a conventional TEM grid has to be fixed in place on a sample carrier with screw connections, is unnecessarily complicated and fragile.

By mounting the sample directly onto the sample carrier, the difficult operation of mounting the fragile grid on the sample carrier becomes unnecessary.

The invention is also based on the insight that it is possible to give a simple form to the sample carrier and the extremity of the sample holder, in such a manner that the sample carrier has a resilient portion that can be clamped onto or into the sample holder via clamping. This can, for example, be achieved by embodying the sample carrier to have a bent lip of resilient material at one extremity, which bent lip falls into a hollow in the sample holder, for example. In this manner, the extremity of the sample holder does not have any mutually movable discrete components. The sample carrier also does not have any mutually movable discrete components. As a result of the lack of such discrete components, the construction is much more robust.

In an embodiment of the co-operative composite structure according to the invention, the sample carrier is formed as a single entity.

By forming the sample carrier to be a single entity, the sample carrier becomes more robust.

An attendant advantage is that this leads to a cheaper sample carrier than the sample carrier of the known JP patent document.

In another embodiment of the co-operative composite structure according to the invention, the sample carrier is arranged to be able to deform in such a manner that attachment or disconnection of the sample carrier to/from the sample holder can proceed without, or almost without, force.

By reducing the force with which the sample carrier clamps onto or into the sample holder during attachment or disconnection, i.e. reducing the force at those moments that the sample holder and sample carrier are in contact with one another and have to move with respect to one another, wear of, for example, the sample holder will reduce. It is hereby also possible to perform attachment or disconnection in vacuum in such a manner that the lack of lubricating means will not lead to undesired jamming (vacuum welding) of components.

This way of attaching or disconnecting can be realized by, for example, depressing the resilient portion of the sample carrier when mounting the sample carrier on the sample holder, so that the sample carrier can be applied to the sample holder without, or almost without, force.

In yet another embodiment of the co-operative composite structure according to the invention, the sample carrier and sample holder are formed in such a way that, when the sample carrier is attached to the sample holder, at least five degrees of freedom are reproducibly fixed.

By reproducibly fixing degrees of freedom, the position of a given location on the sample carrier with respect to the sample holder is better defined. This is of advantage when a sample carrier, on which a sample with a given region of interest is located, is fixed to the sample holder. This is because only a small portion of the sample carrier need be searched when at least five degrees of freedom—e.g. two translation vectors and three angular dependencies—between the sample carrier and the sample holder are fixed.

It should be noted that, even if not all degrees of freedom are reproducibly fixed, once the sample carrier is affixed to the sample holder, the friction that occurs as a result of the resilient force with which the two portions are clamped to one another will prevent mutual movement of the portions.

In a further embodiment of the co-operative composite structure according to the invention, the number of degrees of freedom is reproducibly fixed by using a combination of a contact plane between the two portions, a ridge in one of the portions and a groove in the other portion.

Using this combination, a rotational freedom (in the longitudinal direction of the ridge) and a translational freedom (transverse to the ridge) are, in principle, reproducibly fixed. Together with the requirement of contact at a contact plane between sample carrier and sample holder (as a result of the clamping), five degrees of freedom are thus reproducibly fixed: all rotational freedoms and two of the three translational freedoms.

In another, further embodiment of the co-operative composite structure according to the invention, the number of degrees of freedom is reproducibly fixed by using a contact plane between the two portions, a spherical protrusion in one of the portions and a hole in the other portion.

Using the combination of a sphere and a hole, two translational freedoms are, in principle, fixed. Together with the requirement of contact at a contact plane between sample carrier and sample holder (as a result of the clamping), five degrees of freedom are thus reproducibly fixed: all translational freedoms and two of the three rotational freedoms.

In yet another embodiment of the co-operative composite structure according to the invention, the sample carrier is arranged so that a conventional TEM grid can be mounted thereon.

So as to obtain compatibility with sample holders from other apparatus, which generally use the conventional TEM grids, it is desirable to embody the sample carrier in such a way that a conventional TEM grid can be mounted hereon. This can, for example, be achieved by equipping the sample carrier with lips, which can be folded across the grid so as to attach the grid to the sample carrier.

In another embodiment of the co-operative composite structure according to the invention, the sample carrier is arranged in such a manner that a conventional TEM grid mounted thereon can be demounted.

After a conventional TEM grid has been mounted on the sample carrier according to the invention, if this grid is also to be re-used in apparatus that cannot deal with the sample carrier according to the invention, then it is desirable to be able to remove the TEM grid again. This can, for example, be achieved by using an appropriate punch to cut loose from the sample carrier lips that are folded across the sample so as to attach the grid to the sample carrier, so that the grid is separated from the sample carrier.

In another embodiment of the co-operative composite structure according to the invention, the sample carrier is equipped to attach samples at an edge portion. This embodiment is especially attractive when attaching samples such as are extracted from semiconductor wafers in the semiconductor industry. Such samples are cut out of a semiconductor wafer with the aid of an ion ray. By holding the sample carrier against the sample and administering a gas in the vicinity of the sample, material originating from the gas can be deposited onto the sample and the sample carrier using a focused electron beam or a focused ion beam (Electron Beam Induced Deposition (EBID) and Ion Beam Induced Deposition (IBID)). As a result of this deposition, the sample is adhered to the sample carrier. This adhesion can best be performed at a (protruding) edge portion of the sample carrier, because the sample carrier can then be maneuvered to the sample in the best manner.

In yet another embodiment of the co-operative composite structure according to the invention, the sample carrier contains a metal.

The sample carrier should be made from an electrically conducting material, so as to avoid charging of the sample and the sample carrier as a result of bombardment with charged particles. Such charging can otherwise cause unwanted influencing of, for example, the electron beam or secondary electrons. The sample carrier should also be made from elastic material. By using a metal, one can easily satisfy these requirements.

It should be noted that the whole sample carrier does not have to be made from the same material, but that, for example, the portion on which the sample can be mounted can, for example, be made from an electrically conductive plastic, or can consist of a thin layer of carbon.

In yet another embodiment of the co-operative composite structure according to the invention, the sample carrier contains Mo, Cu, Be, C and/or Si.

The use of sample carriers with a beryllium or carbon extremity, or at least an extremity that is coated with these materials, is known per se, and occurs in those situations involving the study of the X-ray radiation that is emitted as a result of bombarding a sample with electrons. Beryllium and carbon generate relatively little X-ray radiation, because they are materials with few protons in the nucleus. Beryllium and carbon are also good electrically conducting materials, so that charging is prevented.

The use of molybdenum is attractive when, for example, studying semiconductor samples, because these usually do not comprise any molybdenum of themselves. All radiation detected from molybdenum can therefore be neglected and can be attributed to molybdenum present in the sample carrier. Molybdenum is also an elastic and good electrically conducting material, so that charging is prevented.

The use of a copper alloy is attractive because such alloys are often elastic and good electrically conducting materials, which can be processed easily.

The use of silicon is predominantly attractive when studying samples such as are extracted from semiconductor wafers in the semiconductor industry, using X-ray analysis, for example. This is because these samples consist to a large extent of silicon, whereas the structures that are to be studied consist, for example, of metals. The presence of silicon can then be ignored during the X-ray analysis.

In yet another embodiment of the co-operative composite structure according to the invention, the sample carrier demonstrates a perforated portion on which the sample can be mounted.

The perforated portion makes it possible to attach samples in a manner that is known from the use of conventional TEM grids.

In a further embodiment of the co-operative composite structure according to the invention, the perforated portion has a thickness of at most 50 µm.

By embodying the sample carrier at the location of the perforated portion to be thin, e.g. 50 µm or less, the perforated portion, for a given separation of its bars, will also demonstrate good transparency when the sample carrier is canted, so that a sample mounted thereon can be studied at a canting angle.

In another embodiment of the co-operative composite structure according to the invention, the sample carrier is attached to the sample holder with a coupling tool. The use of a coupling tool offers great advantages, in view of the tiny size of the sample carrier.

In another embodiment of the co-operative composite structure according to the invention, the coupling tool is an automatic coupling tool.

An automatic coupling tool makes it possible to automate processes, and it also makes it possible to attach the sample carrier to a sample holder in vacuum. The latter is of particular importance in so-called cryo applications, where a sample carrier that has already been pre-cooled has to be attached to a sample holder at cryogenic temperatures, e.g. temperatures in the vicinity of that of liquid nitrogen or of liquid helium.

In another embodiment of the co-operative composite structure according to the invention, the sample holder is arranged to co-operate with a positioning unit.

Co-operation with a positioning unit, such as a goniometer, makes it possible, for example, to position the co-operative composite structure with respect to an ion beam, so as to thin the sample, or with respect to a electron beam, so as to study the sample.

In yet another embodiment of the co-operative composite structure according to the invention, the sample carrier is provided with an identification code.

The presence of an identification code makes it easy to distinguish between different sample carriers with different samples, though these might otherwise appear to be identical.

In an aspect of the method according to the invention, the sample carrier couples to the sample holder, which method comprises the following steps:
  Picking up the sample carrier using a tool;
  Deforming the sample carrier in such a manner as to greatly reduce the force that, during insertion, is exerted by one portion on the other portion as a result of the resilient force of the resilient element;
  Mutually moving the sample holder and the sample carrier towards one another;
  Coupling the sample carrier to the sample holder, and;
  Releasing the sample carrier from the tool.

In another method according to the invention, the sample carrier decouples from the sample holder, which method comprises the following steps:
  Applying a tool to the sample carrier, which sample carrier is connected to the sample holder;
  Deforming the sample carrier in such a manner as to greatly reduce the force that, during disconnection, is exerted by one portion on the other portion as a result of the resilient force of the resilient element;
  Disconnecting the sample carrier from the sample holder;
  Mutually moving the sample carrier and the sample holder away from one another, and;
  Releasing the sample carrier from the tool.

In a further method according to the invention, coupling of the sample carrier to the sample holder or decoupling of the sample carrier from the sample holder occurs in vacuum.

In a yet further method according to the invention, the vacuum is part of a Transmission Electron Microscope (TEM), a Scanning Transmission Electron Microscopy (STEM), a Scanning Electron Microscope (SEM), an Electron Microprobe Analyzer (EPMA), a Focused Ion Beam apparatus (FIB), an Auger analyzer, a Secondary Ion Mass Spectrometer (SIMS), a Scanning Probe Microscope (SPM), an X-ray analyzer, a sputter coater, a plasma cleaner or an evaporative deposition unit.

In another method according to the invention, the sample is applied to the sample carrier by at least partially coating the sample carrier with a liquid or powdery material.

In a further method according to the invention, before attaching the sample to the sample carrier, at least a portion of the sample carrier is provided with a sticky layer, after which the sample is adhered to the sticky layer.

The invention will now be elucidated on the basis of figures, whereby the same reference numerals indicate corresponding structures.

BRIEF DESCRIPTION OF THE DRAWINGS

To this end:
FIG. 2 schematically shows the sample carrier according to the invention;
FIG. 3 schematically shows the extremity of the sample holder according to the invention.

DETAILED DESCRIPTION OF PREFERRED EMBODIMENTS

Figure 4A:
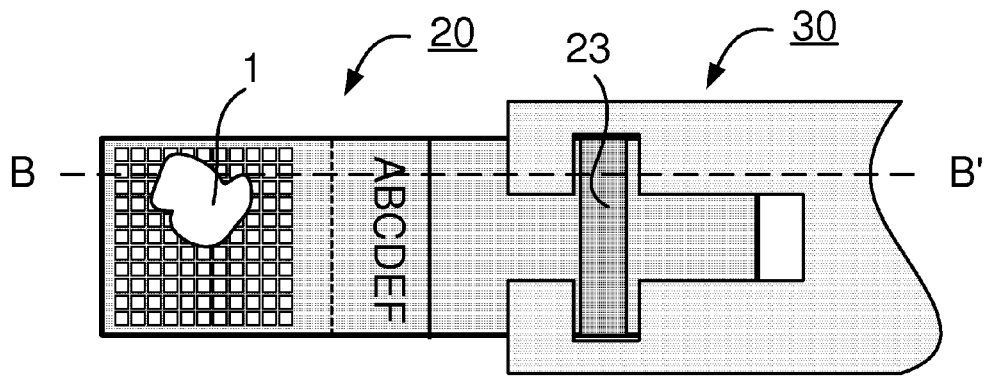
FIG. 4 schematically shows the sample carrier and the sample holder according to the invention, which are coupled to one another.

FIG. 2 schematically shows in a front view (FIG. 2A) and in top view (FIG. 2B) a sample carrier according to the invention.

The sample carrier 20, formed from a thin strip 21 of, for example, molybdenum with a width 28, is folded at fold 22 and demonstrates a ridge 23. An extremity 24 of this strip 21 is provided with a gauze-like portion 25. This extremity 24 can have the same thickness as the rest of the strip 21, but can also be thinner, as here depicted.

Beside the extremity 24, an identification region 26 is present on the strip, where an identification code has been applied.

In non-depressed state, the sample carrier has a height 27.

By now moving points X and X', for example, toward one another, this height 27 will decrease, and a resilient force will arise with which the sample carrier can clamp into the sample holder.

It should be noted that the designation "side view", "top view" and "front view" are defined with respect to the electron beam in a TEM; usually, this beam is incident from above upon the gauze-like portion of the sample carrier, such as a conventional TEM grid or a sample carrier according to the invention.

FIG. 3 schematically shows the extremity of the sample holder according to the invention in side (FIG. 3A), top view (FIG. 3B) and in a front view (FIG. 3C).

The extremity of the sample holder has a cavity 31 with a width 32 and a height 33. The width 32 is somewhat larger than the width of the sample carrier 20, and the height 33 is somewhat smaller than the height 27 of the sample carrier in non-depressed state. There are also two hollows 35 present, with a width 36. As will be elucidated in FIG. 5, these hollows 35 with width 36 make it possible to use a coupling tool, with a width at the tip somewhat smaller than the width 36, for the purpose of coupling and decoupling the sample carrier 20 to/from the sample holder 30. Furthermore, the sample holder 30 demonstrates a contact plane 37.

Figure 4B:
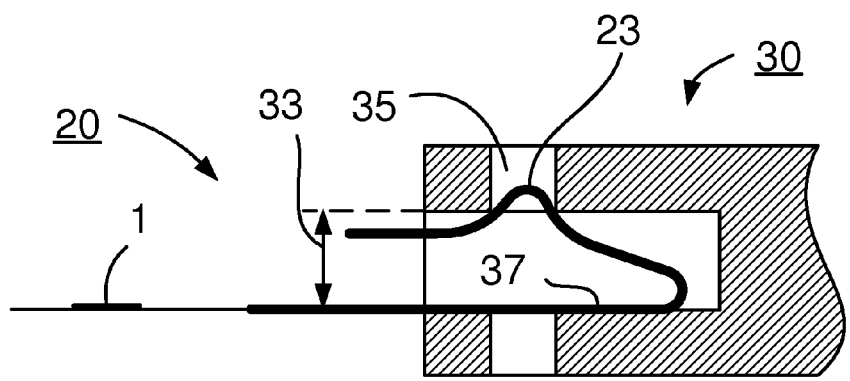

FIG. 4 schematically shows the sample carrier and the sample holder according to the invention, which are coupled to one another.

Sample carrier 20, with a sample 1 thereon, is slid into sample holder 30. The sample carrier lies on contact plane 37 of the sample holder 30, and ridge 23 of the sample carrier falls into one of the hollows 35 of the sample holder. Because the height 33 of the sample holder is a little smaller than the height 27 of the sample carrier in its non-depressed state, a clamping of the sample carrier 20 in the sample holder 30 will occur.

As a result of laying the sample carrier 20 on the contact plane 37, and because ridge 23 falls into one of the hollows 35, five of the six degrees of freedom with which the sample carrier 20 can be attached into the sample holder 30 are reproducibly fixed; only the position of the sample carrier with respect to the sample holder in the longitudinal direction of the ridge 23 is not fixed.

It should be noted that, although the position of the sample carrier 20 with respect to the sample holder 30 in the longitudinal direction of the ridge 23 is not fixed, this can not lead to mutual movement, because the friction occurring as a result of the clamping prevents such movement.

It should be noted that embodiments are also possible whereby the ridge is made in the sample holder 30 and the groove is made in the sample carrier 20.

Figure 5A:
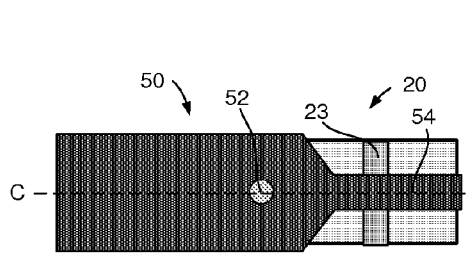
FIG. 5 schematically shows a coupling tool, with therein the sample carrier according to the invention.
Figure 5B:
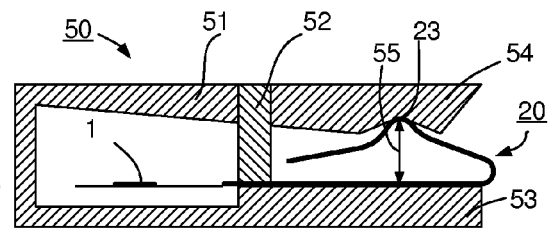

FIG. 5 schematically shows a coupling tool and a sample carrier according to the invention.

The coupling tool 50 consists of a resilient body 51 with two jaws 53 and 54, and a stop 52. The sample carrier 20 with sample 1 can be slid into the coupling tool, as shown.

Normally, the coupling tool will be somewhat open, in such a manner that the distance 55 between the jaws 53 and 54 of the coupling tool is greater than the height 27 of the sample carrier 20 in non-depressed state. By now pushing the jaws 53 and 54 toward one another, the sample carrier located in the coupling tool is depressed. The stop 52 limits the maximal amount by which the coupling tool is depressed. The maximal amount of depression is such that the height 27 is limited by the stop 52 at a height that is a little smaller than the height 33 of the sample holder 30. In this manner, it is possible to depress the sample carrier 20 in such a way that it can be inserted into the sample holder 30 without touching the latter.

The jaws 53 and 54 are narrowed, so that these will fit within the hollow 35 of the sample holder 30. To this end, the width of the jaws 53 and 54 is a little smaller than the width 36 of the hollows 35 in the sample holder 30.

It should be noted that embodiments of the coupling tool are also possible whereby the movement of the jaws is realized using, for example, an electric motor. Such a coupling tool, which may be part of a TEM, for example, can then be embodied as an automatic coupling tool, whereby coupling and decoupling occur under the control of a control unit.

It is also possible with such an automatic coupling tool to perform coupling or decoupling of the sample carrier in vacuum.

Figure 6A:
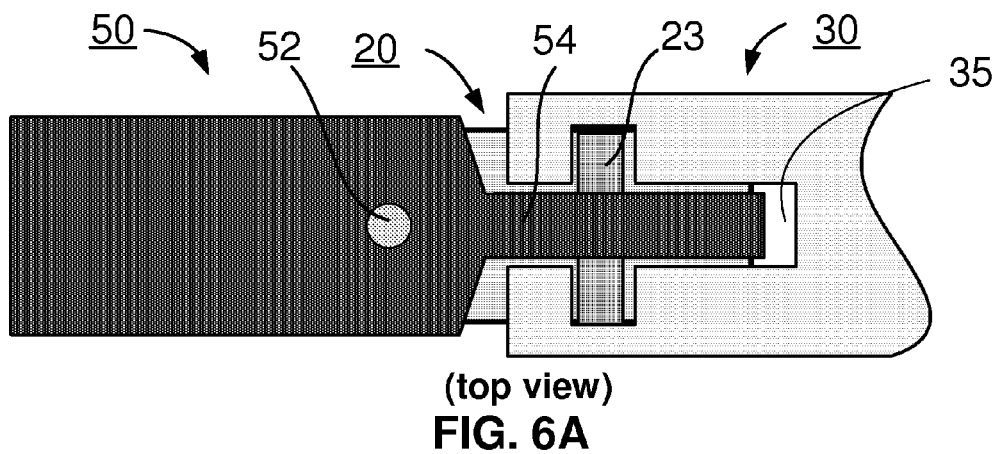
FIG. 6A schematically shows a coupling tool, the sample carrier and the sample holder according to the invention.

FIG. 6A schematically shows a coupling tool, the sample carrier and the sample holder according to the invention.

In this figure, it can be seen how the jaws 53 and 54 of the coupling tool 50 fall within the hollow 35 of the sample holder 30.

Figure 7A:
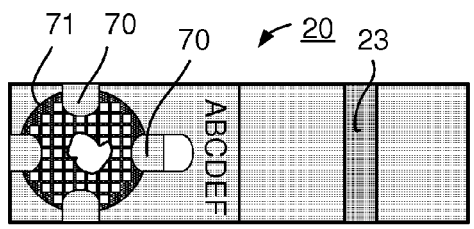
FIG. 7 schematically shows an embodiment of the sample carrier according to the invention, which is suited to carrying a conventional TEM grid.
Figure 7B:
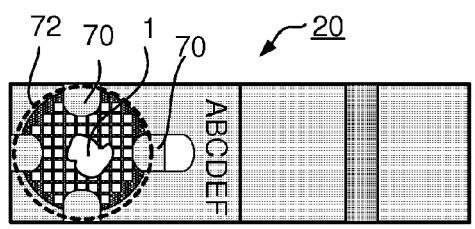

FIG. 7 schematically shows an embodiment of the sample carrier according to the invention, which is suited to carrying a conventional TEM grid.

In this embodiment, the sample carrier 20 demonstrates four lips 70 that can be folded down. By placing a conventional TEM grid 71, with a sample 1 mounted thereon, upon the sample carrier, and by subsequently folding down the lips 70, the grid 71 is attached to the sample carrier 20.

By cutting off the lips 70, e.g. with a punch that cuts through the sample carrier 20 along the contour 72, the grid 71 with the sample 1 located thereupon is freed once again, and the grid 71 can, for example, be attached once again to traditional TEM sample holders.

Figure 8:
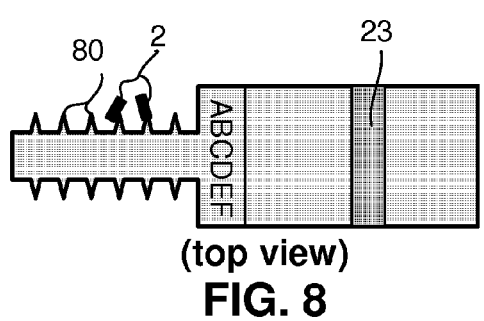
FIG. 8 schematically shows a sample holder according to the invention, which is suited to attaching samples at edge portions.

FIG. 8 schematically shows a sample carrier according to the invention, which is suited to attaching samples at edge portions.

As a result of the presence of several protruding portions 80, this embodiment lends itself to the adhesion to the sample carrier of samples such as semiconductor samples 2, e.g. by adhesion using ion deposition or using a sticky substance.

Figure 9:
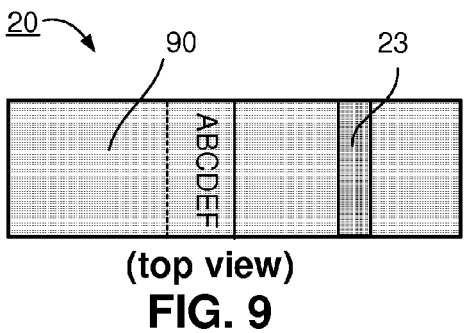
FIG. 9 schematically shows a sample carrier according to the invention, which is suited to having a liquid or powdery sample stuck thereto.

FIG. 9 schematically shows a sample carrier according to the invention, which is suited to having a liquid or powdery sample stuck thereto.

In, for example, the petrochemical industry, there is a need to study materials that are present in solution with a volatile liquid. By dipping the extremity 90 of the sample carrier into the solution and subsequently allowing the volatile liquid to evaporate, the material that is to be studied is left behind on the sample carrier. By suitably choosing the volatile liquid, adhesion of the material to be studied onto the sample carrier will thereby occur.

It is also possible to first coat the extremity 90 of the sample carrier with a sticky layer, after which the material to be studied, e.g. as a powdery material, can adhere to the sample carrier.

It should be noted that this embodiment shows a sample carrier that is not transparent to electrons, so that the sample therefore cannot be irradiated through by a particle beam. In general, however, the presence of a gauze-like portion is not a requirement for many study techniques.

Study techniques that do not require a gauze-like portion are, for example, Auger spectroscopy, SEM and X-ray analysis.

It should also be noted that it is possible to make a sample carrier that is similar to the sample carrier of FIG. 9 but that is transparent to electrons, e.g. by embodying the extremity 90 as a thin film of carbon or, for example, silicon nitride, with or without local reinforcement using a gauze.

Although the preceding text describes a combination of a sample carrier and a sample holder whereby the sample carrier clamps within a hollow of the sample holder, the inventor is aware that there are also embodiments whereby the sample carrier clamps around the sample holder.

Protection is also sought for this and for other embodiments and methods such as can be derived by the skilled artisan herefrom.

I claim:

1. A co-operative composite structure of a sample carrier and sample holder arranged so that a sample can be attached thereto, which sample carrier and sample holder are arranged to be used in a vacuum, comprising:

A first portion embodied as a sample holder with an extremity that is removably attachable to the sample carrier;

A second portion embodied as a sample carrier comprising a deformable structure having a depressed state and a non-depressed state, in which the deformable structure includes a strip of material folded back upon itself to define a height between a lower portion of the deformable structure and an upper portion of the deformable structure, such that the height changes as the structure is deformed from the non-depressed state toward the depressed state, and the sample carrier is arranged so that the sample can be attached thereto or thereon, which sample carrier is also removably attachable to the sample holder; and Whereby the removable attachment functionality is realized by deforming the sample carrier with a tool in such a manner as to reduce the force that, during attachment or disconnection, is exerted by the two portions upon one another.

2. A co-operative composite structure according to claim 1, whereby the sample carrier is formed as a single entity.

3. A co-operative composite structure according to claim 1, whereby the sample carrier and the sample holder are formed in such a way that, when they are attached to one another, at least five degrees of freedom are reproducibly fixed.

4. A co-operative composite structure according to claim 3, whereby five degrees of freedom are reproducibly fixed by using a combination of a contact plane between the two portions, a ridge in one portion and a groove in the other portion.

5. A co-operative composite structure according to claim 3, whereby five degrees of freedom are reproducibly fixed by using a combination of a contact plane between the two portions, a spherical protrusion in one portion and a hole in the other portion.

6. A co-operative composite structure according to claim 1, whereby the sample carrier has a conventional TEM grid mounted thereon.

7. A co-operative composite structure according to claim 6, wherein the conventional TEM grid mounted thereon can be demounted.

8. A co-operative composite structure according to claim 1, whereby the sample carrier is equipped to attach samples at an edge portion.

9. A co-operative composite structure according to claim 1, whereby the sample carrier contains a metal.

10. A co-operative composite structure according to claim 1, whereby the sample carrier contains Mo, Cu, Be, C and/or Si.

11. A co-operative composite structure according to claim 1, whereby the sample carrier demonstrates a perforated portion, on which portion a sample can be mounted.

12. A co-operative composite structure according to claim 11, whereby the perforated portion has a thickness of at most 50 μm.

13. A co-operative composite structure according to claim 1, whereby the sample holder is arranged to co-operate with a positioning unit.

14. A co-operative composite structure according to claim 1, whereby the sample carrier has an identification code.

15. A sample carrier for use in a co-operative composite structure, the co-operative composite structure including the sample carrier and a sample holder, comprising
a deformable structure having a depressed state and a non-depressed state, in which the deformable structure includes a strip of material folded back upon itself to define a height between a lower portion of the deformable structure and an upper portion of the deformable structure, such that the height changes as the structure is deformed from the non-depressed state toward the depressed state.

16. A co-operative composite structure of a sample carrier and sample holder arranged so that a sample can be attached thereto, which sample carrier and sample holder are arranged to be used in a vacuum, comprising:

A first portion embodied as a sample holder with an extremity that is removably attachable to a sample carrier, the extremity having a resilient element;

A second portion embodied as the sample carrier, arranged so that the sample can be attached thereto or thereon, which sample carrier is removably attachable to the extremity of the sample holder;

Whereby the sample carrier is able to deform from a non-depressed state toward a depressed state such that attachment or disconnection of the sample carrier to/from the sample holder can proceed with less force while held toward the depressed state than in the non-depressed state, Whereby the arrangement to be able to deform the sample carrier includes a deformable structure, the deformable structure including a strip of material folded back upon itself to define a height between a lower portion of the deformable structure and an upper portion of the deformable structure, such that the height decreases as the upper and lower portions are moved toward each other from the non-depressed state toward the depressed state;

Whereby the sample carrier and the sample holder are formed in such a way that, when they are attached to one another, at least five degrees of freedom are reproducibly fixed; and Whereby the removable attachment functionality is realized with the aid of clamping the resilient element to the deformable structure.

17. A co-operative composite structure according to claim 16, whereby five degrees of freedom are reproducibly fixed by using a combination of a contact plane between the two portions, a ridge in one portion and a groove in the other portion.

18. A co-operative composite structure according to claim 16, whereby five degrees of freedom are reproducibly fixed by using a combination of a contact plane between the two portions, a spherical protrusion in one portion and a hole in the other portion.

* * * * *